US012712030B2

(12) United States Patent
Tseng

(10) Patent No.: US 12,712,030 B2
(45) Date of Patent: Aug. 18, 2026

(54) MEMORY SYSTEM AND OPERATING METHOD THEREOF WITH TRACKING ARRAY TO ADJUST SENSING TIME FOR ACCURACY

(71) Applicant: MACRONIX INTERNATIONAL CO., LTD., Hsinchu (TW)

(72) Inventor: Po-Hao Tseng, Taichung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 208 days.

(21) Appl. No.: 18/540,940

(22) Filed: Dec. 15, 2023

(65) Prior Publication Data

US 2025/0118377 A1 Apr. 10, 2025

Related U.S. Application Data

(60) Provisional application No. 63/542,771, filed on Oct. 6, 2023.

(51) Int. Cl.
*G11C 16/28* (2006.01)
*G11C 29/02* (2006.01)
*G11C 16/32* (2006.01)

(52) U.S. Cl.
CPC ............ *G11C 16/28* (2013.01); *G11C 29/028* (2013.01); *G11C 16/32* (2013.01)

(58) Field of Classification Search
CPC ........ G11C 16/28; G11C 29/028; G11C 16/32
See application file for complete search history.

(56) References Cited

U.S. PATENT DOCUMENTS 6,009,040 A * 12/1999 Choi .................. G11C 11/5621 365/194
2019/0295610 A1* 9/2019 Fantini .............. G11C 13/0033
2020/0066363 A1 2/2020 Yang
2023/0197174 A1 6/2023 Guo
2023/0238037 A1 7/2023 Tseng et al.

FOREIGN PATENT DOCUMENTS

TW 392165 B 6/2000

OTHER PUBLICATIONS

Tseng, P.-H. et al., “In-Memory Approximate Computing Architecture Based on 3D-NAND Flash Memories” 2022 Symposium on VLSI Technology & Circuits Digest of Technical Papers, pp. 270-271. (ref. 01, file attached).

* cited by examiner

*Primary Examiner* — Alexander Sofocleous
*Assistant Examiner* — Joseph Fidelis Stormes
(74) *Attorney, Agent, or Firm* — McClure, Qualey & Rodack, LLP

(57) ABSTRACT

An operating method of a memory system is disclosed herein. The operating method includes: inputting tracking data to a tracking array; generating tracking logic values by tracking cell columns of the tracking array according to the tracking data; counting the tracking logic values to generate a summation value; adjusting a sensing time of a sensing device according to the summation value; performing a computing operation by a computing array to generate computing signals; and sensing the computing signals by the sensing device according to the adjusted sensing time.

7 Claims, 10 Drawing Sheets

600

700

120

MEMORY SYSTEM AND OPERATING METHOD THEREOF WITH TRACKING ARRAY TO ADJUST SENSING TIME FOR ACCURACY

CROSS-REFERENCE TO RELATED APPLICATION

This application claims priority to US U.S. Provisional Application No. 63/542,771, filed Oct. 6, 2023, which is herein incorporated by reference in its entirety.

BACKGROUND

Technical Field

The present disclosure relates to a memory technique. More particularly, the present disclosure relates to a memory system and an operating method of a memory system.

Description of Related Art

A memory system includes multiple memory cells configured to store data bits. When the memory system performs a computing operation, computing signals are generated. Threshold voltage levels of the memory cells are affected by environment temperatures, retention times and disturbances, such that the computing signals are biased. As a result, the sensing results performed to the computing signals are not accurate. Thus, techniques associated with the designing for overcoming the problems described above are important issues in the field.

SUMMARY

The present disclosure provides an operating method of a memory system is disclosed herein. The operating method includes: inputting tracking data to a tracking array; generating tracking logic values by tracking cell columns of the tracking array according to the tracking data; counting the tracking logic values to generate a summation value; adjusting a sensing time of a sensing device according to the summation value; performing a computing operation by a computing array to generate computing signals; and sensing the computing signals by the sensing device according to the adjusted sensing time.

In some embodiment, adjusting the sensing time of the sensing device according to the summation value includes: comparing the summation value and a quantity of the tracking cell columns; when the summation value is different from the quantity of the tracking cell columns, adjusting the sensing time; and when the summation value is equal to the quantity of the tracking cell columns, determining the sensing time.

In some embodiment, the operating method further includes: setting the sensing time as a first sensing time; generating tracking signals according to the tracking data by the tracking cell columns; sensing the tracking signals according to the first sensing time to generate first tracking logic values; counting the first tracking logic values to generate a first summation value; and when the first summation value is equal to a quantity of the tracking cell columns, setting the sensing time as a second sensing time, in which the second sensing time is smaller than the first sensing time.

In some embodiment, the operating method further includes: sensing the tracking signals according to the second sensing time to generate second tracking logic values; counting the second tracking logic values to generate a second summation value; when the second summation value is different from the quantity of the tracking cell columns, setting the sensing time as the first sensing time; and sensing the computing signals according to the first sensing time by the sensing device.

In some embodiment, the operating method further includes: before setting the sensing time as the first sensing time, setting the sensing time as an initial sensing time; sensing the tracking signals according to the initial sensing time to generate initial tracking logic values; counting the initial tracking logic values to generate an initial summation value; and when the initial summation value is equal to the quantity of the tracking cell columns, setting the sensing time as a third sensing time, in which the third sensing time is smaller than the initial sensing time.

In some embodiment, a difference between the third sensing time and the initial sensing time is equal to a difference between the first sensing time and the second sensing time.

In some embodiment, the operating method further includes: setting the sensing time as a first sensing time; generating tracking signals according to the tracking data by the tracking cell columns; sensing the tracking signals according to the first sensing time to generate first tracking logic values; counting the first tracking logic values to generate a first summation value; and when the first summation value is different from a quantity of the tracking cell columns, setting the sensing time as a second sensing time, in which the second sensing time is larger than the first sensing time.

In some embodiment, the operating method further includes: sensing the tracking signals according to the second sensing time to generate second tracking logic values; counting the second tracking logic values to generate a second summation value; and when the second summation value is equal to the quantity of the tracking cell columns, setting the sensing time as a third sensing time, in which the third sensing time is larger than the second sensing time.

In some embodiment, the operating method further includes: sensing the tracking signals according to the third sensing time to generate third tracking logic values; counting the second tracking logic values to generate a third summation value; when the third summation value is equal to the quantity of the tracking cell columns, setting the sensing time as the second sensing time; and sensing the computing signals according to the second sensing time by the sensing device.

In some embodiment, the operating method further includes: before setting the sensing time as the first sensing time, setting the sensing time as an initial sensing time; sensing the tracking signals according to the initial sensing time to generate initial tracking logic values; counting the initial tracking logic values to generate an initial summation value; and when the initial summation value is equal to the quantity of the tracking cell columns, setting the sensing time as a fourth sensing time, in which the fourth sensing time is larger than the initial sensing time.

In some embodiment, a difference between the fourth sensing time and the initial sensing time is equal to a difference between the first sensing time and the second sensing time.

In some embodiment, each of tracking bits of the tracking data has the same logic value.

The present disclosure provides a memory system. The memory system includes tracking cell columns, a computing array and a sensing device. The tracking cell column is configured to generate tracking logic values according to tracking data. The computing array is configured to generate computing signals. The sensing device is configured to sense the computing signals according to a clock signal. The sensing device includes a segment circuit configured to count the tracking logic values to generate a summation value, when the summation value is different from a preset value, a period of the clock signal is adjusted, and when the summation value is equal to preset value, the period of the clock signal is determined for sensing the computing signals.

In some embodiment, reference data bits stored in each tracking cell column of the tracking cell columns has P first logic value, and P is a positive integer.

In some embodiment, the memory system further includes a tracking array. Along a direction, a quantity of a first logic value of the tracking bits is increased gradually.

In some embodiment, along the direction, a quantity of a second logic value of the tracking bits is decreased gradually, and the first logic value is different from the second logic value.

In some embodiment, the preset value is a quantity of the tracking cell columns.

The present disclosure provides an operating method of a memory system. The operating method includes: counting tracking logic values to generate a summation value; comparing the summation value with a preset value; when the summation value is different from the preset value, adjusting a period of a clock signal; when the summation value is equal to the preset value, determining the period; and after the period is determined, performing a computing operation and sensing computing signals from the computing operation according to the clock signal.

In some embodiment, the operating method further includes: during a first period, operating the clock signal by a first sensing time to generate first tracking logic values; counting the first tracking logic values to generate a first summation value; during a second period, operating the clock signal by a second sensing time to generate second tracking logic values; and counting the second tracking logic values to generate a second summation value, in which the first period is before the second period, and the first sensing time is larger than the second sensing time.

In some embodiment, the operating method further includes: in response to the first summation value being equal to the preset value and the second summation value being different from the preset value, sensing the computing signals according to the first sensing time.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
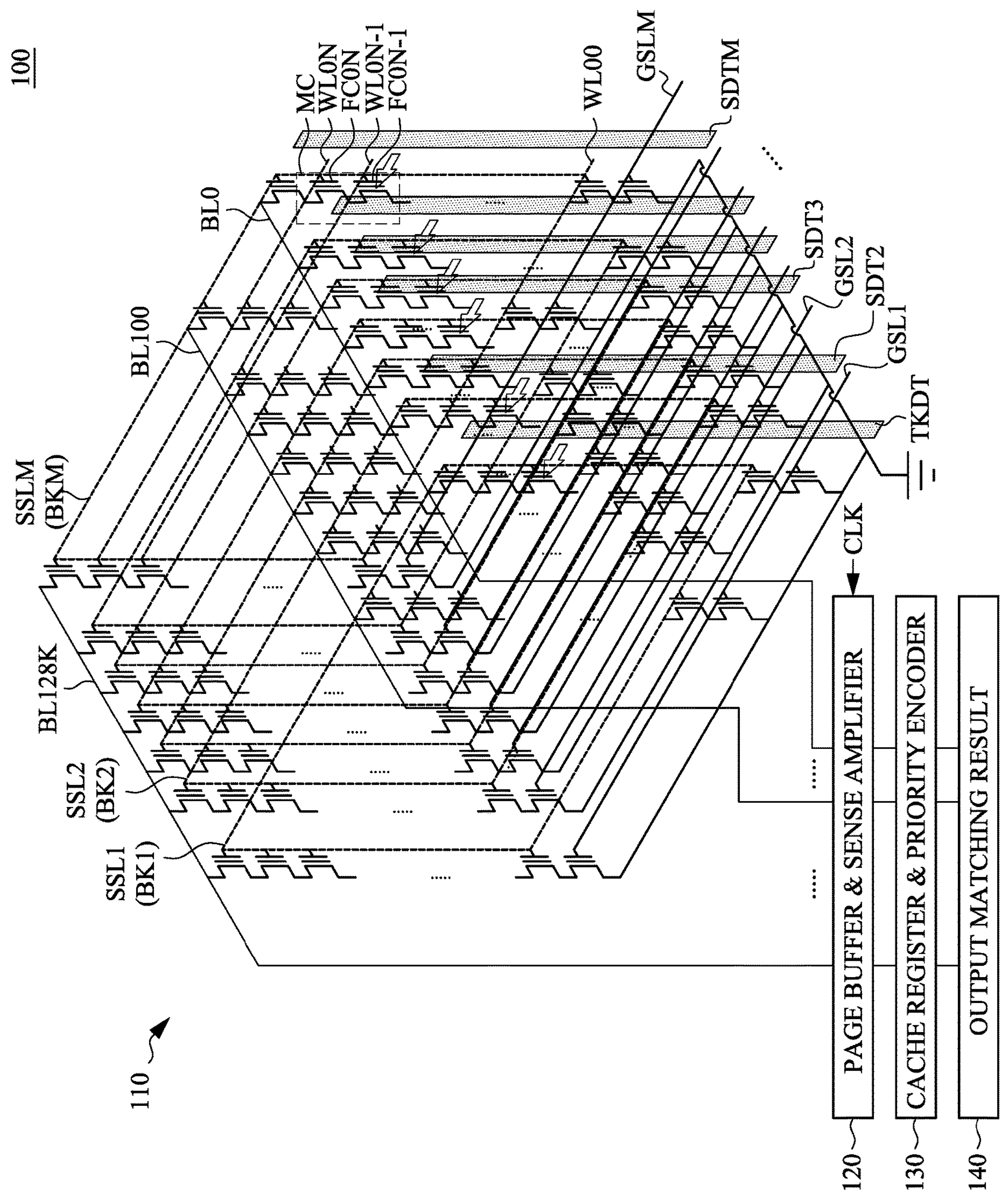
FIG. 1A is a schematic diagram of a memory system illustrated according to some embodiments of present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1A is a schematic diagram of a memory system 100 illustrated according to some embodiments of present disclosure. As shown in FIG. 1A, the memory system 100 includes a three-dimensional (3D) memory array 110, a sensing device 120, a register encoding device 130 and an output device 140.

In some embodiments, the sensing device 120 can includes page buffers and sense amplifiers, and is configured to sense tracking signals and computing signals generated by the 3D memory array 110 according to a clock signal CLK. The register encoding device 130 can includes cache registers and priority encoders. The output device 140 is configured to output the matching results of the 3D memory array 110.

As shown in FIG. 1A, the 3D memory array 110 includes multiple blocks BK1-BKM, in which M is a positive integer. The blocks BK1-BKM are arranged in order. The blocks BK1-BKM are configured to receive string select line signals SSL1-SSLM, respectively. The string select line signal SSL1 is configured to control a tracking array in the block BK1. The string select line signal SSL2 is configured to control a computing array in the block BK2. The string select line signal SSL3 is configured to control a computing array in the block BK3, and so on. The string select line signal SSLM is configured to control a computing array in the block BKM. In some embodiments, the blocks BK1-BKM are configured to receive ground select line signals GSL1-GSLM, respectively.

As shown in FIG. 1A, each of the blocks BK1-BKM includes multiple switch elements. The switch elements are configured to form multiple memory cell columns. The memory cell columns are configured to output corresponding bit line signals BL0-BL128K to the sensing device 120, in which K represents 1000. In various embodiments, 128K can be substituted by other positive integers.

In some embodiments, each memory cell in the memory cell columns can be formed by two switch elements which are adjacent with each other and are coupled in series. For example, a memory cell MC in the FIG. 1A can be formed by switch elements FC0N and FCN-1, in which N is a positive integer. A control terminal of the switch element FC0N is configured to receive a word line signal WL0N, and a control terminal of the switch element FC0N-1 is configured to receive a word line signal WL0N-1.

In some embodiments, one memory cell can store one data bit by threshold voltage levels of the switch elements. For example, when the data bit of the memory cell MC has a logic value 0, the switch element FC0N has a threshold voltage level VTH and the switch element FC0N-1 has a threshold voltage level VTL. When the data bit of the memory cell MC has a logic value 1, the switch element FC0N has the threshold voltage level VTL and the switch element FC0N-1 has the threshold voltage level VTH. In some embodiments, the threshold voltage level VTH is larger than the threshold voltage level VTL.

In some embodiments, two word line signals can be configured to carry one search bit. For example, when the search bit of the word line signals WL0N and WL0N-1 has the logic value 0, the word line signal WL0N has a word line bias voltage level VWH and the word line signal WL0N-1 has a word line bias voltage level VWL. When the search bit of the word line signals WL0N and WL0N-1 has the logic value 1, the word line signal WL0N has a word line bias voltage level VWL and the word line signal WL0N-1 has a word line bias voltage level VWH. In some embodiments, the word line bias level VWH is larger than the word line bias voltage level VWL. In some embodiments, the search bit can be referred to as an in-memory search (IMS) search bit.

In some embodiments, when the logic value of the data bit of the memory cell MC is same as the logic value of the search bit carried by the word line signals WL0N and WL0N-1, the data bit and the search bit match each other. At this moment, a current flowing through the memory cell MC is larger, such that a current of the bit line signal BL0 is larger. When the logic value of the data bit of the memory cell MC is different from the logic value of the search bit carried by the word line signals WL0N and WL0N-1, the data bit and the search bit mismatch each other. At this moment, the current flowing through the memory cell MC is smaller, such that the current of the bit line signal BL0 is smaller. Other memory cells in the 3D memory array 110 and the bit line signals BL0-BL128K also have similar relationship. Alternatively stated, the currents of the bit line signals BL0-BL128K can correspond to the matching results of the 3D memory array 110 performing the searching operation.

In some embodiments, the tracking array in the block BK1 can track threshold bias induced by environment temperatures, retention times and disturbances, and re-define a sensing time of the page buffer in the sensing device 120 for the computing arrays in the blocks BL2-BLM according to the tracking results.

In some embodiments, tracking data TKDT is inputted into the tracking array in the block BK1 to perform the tracking operation. During the tracking operation, the string select line signal SSL1 has an enable voltage level, such that the tracking array in the block BK1 is activated. At this moment, the tracking array compares the tracking data TKDT and reference data bits stored in the tracking array to generate the bit line signals BL0-BL128K carried tracking logic values. Then, the sensing device 120 receives the bit line signals BL0-BL128K, and re-defines the sensing time, such as adjusting a period of the clock signal CLK.

In some embodiments, after the sensing time is re-defined, the computing arrays in the blocks BK2-BKM are activated by the string select line signals SSL2-SSLM in order to perform the computing operation, such as the search operation, to generate the bit line signals BL0-BL128K carrying the matching results. Alternatively stated, when the computing operation is performed, the bit line signals BL0-BL128K can be referred to as the computing signals generated by the computing arrays in the blocks BK2-BKM.

For example, after the tracking operation, the string select line signal SSL2 has the enable voltage level, such that the computing array in the block BK2 is activated and receives the search data SDT2 to perform the computing operation, such as comparing the search data SDT2 and the data bits stored in the block BK2 to generate corresponding computing signals. At this moment, the other string select line signals SSL1 and SSL3-SSLM has the disable voltage level, such that the tracking array in the block BK1 and the computing arrays in the blocks BK3-BKM are turned off.

Then, after the block BK2 performing the computing operation, the string select line signal SSL3 has the enable voltage level, such that the computing array in the block BK3 is activated and receives the search data SDT3 to perform the computing operation, such as comparing the search data SDT3 and the data bits stored in the block BK3 to generate corresponding computing signals. At this moment, the other string select line signals SSL1, SSL2 and SSL4-SSLM has the disable voltage level, such that the tracking array in the block BK1 and the computing arrays in the blocks BK2, BK4-BKM are turned off, and so on.

Eventually, after the block BKM-1 performing the computing operation, the string select line signal SSLM has the enable voltage level, such that the computing array in the block BKM is activated and receives the search data SDTM to perform the computing operation, such as comparing the search data SDTM and the data bits stored in the block BKM to generate corresponding computing signals. At this moment, the other string select line signals SSL1-SSLM-1 has the disable voltage level, such that the tracking array in the block BK1 and the computing arrays in the blocks BK2-BKM-1 are turned off.

In some embodiments, the search data SDT2-SDTM can be carried by word line signals. For example, the search data SDTM can be carried by the word line signals WL00-WL0N. The word line signals WL00 and WL01 can carry a first search bit in the search data SDTM. The word line signals WL02 and WL03 can carry a second search bit in the search data SDTM. The word line signals WL04 and WL05 can carry a third search bit in the search data SDTM. The word line signals WL06 and WL07 can carry a fourth search bit in the search data SDTM, and so on.

In some embodiments, the computing array in the block BKM can perform the searching operation according to the search data SDTM carried by the word line signals WL00-WL0N, to compare the search bits and the data bits stored in the memory cells in the block BKM, and generate the corresponding bit line signals BL0-BL128K as the computing signals.

In some embodiments, the sensing device 120 can sense the computing signals generated by the computing arrays in the blocks BK2-BKM according to the re-defined sensing time, such as the period of the adjusted clock signal CLK.

In some approaches, threshold voltage levels of the memory cells are affected by environment temperatures, retention times and disturbances, such that the computing signals are biased. As a result, the sensing results performed to the computing signals are not accurate.

Compared to above approaches, in some embodiments of present disclosure, before the computing operations, the tracking array in the block BK1 performs the tracking operation to adjust the sensing time, such that the effect of threshold voltage bias can be cancelled. As a result, an accuracy of the sensing device 120 sensing the computing signals generated from the computing operation is improved.

In some embodiments, the memory cells in the 3D memory array 110 can be referred to as in-memory searching (IMS) cells. The IMS cells can be implemented by floating gate memory, split-gate memory, silicon-oxide-nitride-oxide-silicon (SONOS) memory, floating dot memory, dynamic random-access memory (DRAM) and/or other devices similar with DRAM, such as 2T0C memory. In some embodiments, the memory cell can also be implemented by emerging memory, such as ferroelectric field-effect transistor (FeFET). In various embodiments, the memory system can be implemented by 2D flash structure or 3D flash structure.

Figure 1B:
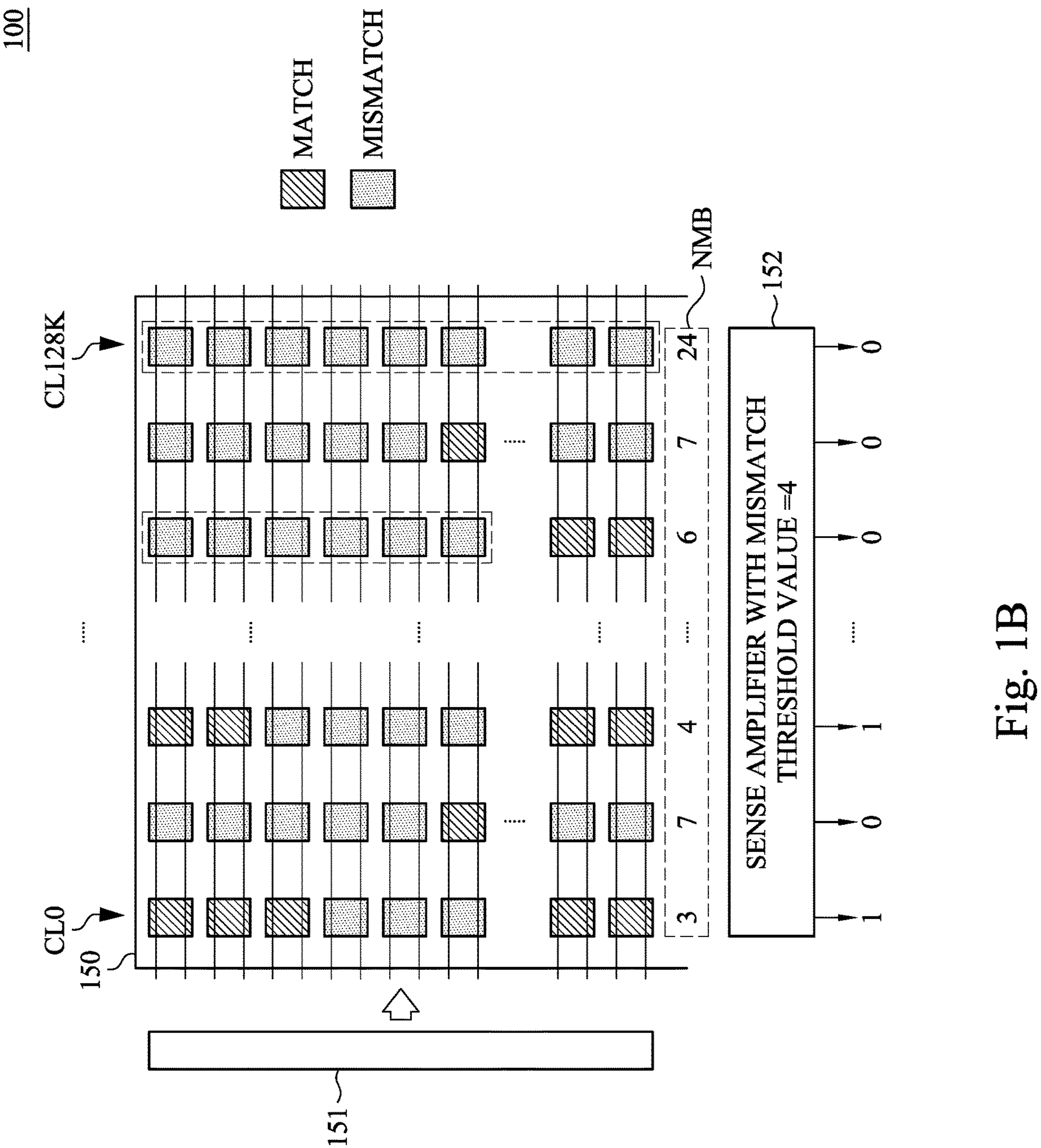
FIG. 1B is a schematic diagram of a portion of the memory system performing a searching operation illustrated according to some embodiments of present disclosure.

FIG. 1B is a schematic diagram of a portion of the memory system 100 performing a search operation illustrated according to some embodiments of present disclosure. As shown in FIG. 1B, the memory system 100 includes a computing array 150 and a sensing amplifier 152. The computing array 150 is configured to receive search data 151, and compare the search data 151 and data bits stored in the computing array 150. Referring to FIG. 1B and FIG. 1A, the computing array 150 can be an embodiment of one of the computing arrays in the blocks BK2-BKM, the search data can be a corresponding one of the search data SDT2-SDTM, and the sensing amplifier can be included in the sensing device 120.

As shown in FIG. 1B, the computing array 150 includes multiple memory cell columns CL0-CL128K. Current levels of the bit line signals BL0-BL128K correspond to the matching results of the search data 151 and the data bits stored in the memory cell columns CL0-CL128K, respectively. For example, when a quantity of the data bits in the memory cell column CL0 and the search data 151 being matched is increased, the current level of the bit line signal BL0 is increased. In contrast, when a quantity of the data bits in the memory cell column CL0 and the search data 151 being matched is decreased, the current level of the bit line signal BL0 is decreased.

Alternatively stated, the bit line signals BL0-BL128K can be configured to carry mismatch bit numbers NMB between the search data 151 and the memory cell columns CL0-CL128K. In the embodiments shown in FIG. 1B, the slash line screentone represents the memory cells which match with the search data 151, and the dot screentone represents the memory cells which mismatch with the search data 151.

For example, in response to 3 mismatch bits between the search bits of the search data 151 and the data bits stored in the memory cell column CL0, the mismatch bit number NMB corresponds to the memory cell column CL0 is 3. In response to 7 mismatch bits between the search bits of the search data 151 and the data bits stored in the memory cell column CL1, the mismatch bit number NMB corresponds to the memory cell column CL1 is 7. In response to 4 mismatch bits between the search bits of the search data 151 and the data bits stored in the memory cell column CL2, the mismatch bit number NMB corresponds to the memory cell column CL2 is 4. In response to 6 mismatch bits between the search bits of the search data 151 and the data bits stored in the memory cell column CLM-2, the mismatch bit number NMB corresponds to the memory cell column CLM-2 is 6. In response to 7 mismatch bits between the search bits of the search data 151 and the data bits stored in the memory cell column CLM-1, the mismatch bit number NMB corresponds to the memory cell column CLM-1 is 7. In response to 24 mismatch bits between the search bits of the search data 151 and the data bits stored in the memory cell column CLM, the mismatch bit number NMB corresponds to the memory cell column CLM is 24. In some embodiments, the mismatch bit numbers NMB represent Hamming distances between the search data 151 and the string data of the memory cell columns CL0-CL128K.

In some embodiments, the sensing amplifier 152 is configured to output corresponding logic values. Specifically, when the mismatch bit number NMB is larger than a mismatch threshold value, the sensing amplifier 152 outputs the logic value 0. When the mismatch bit number NMB is larger than the mismatch threshold value, the sensing amplifier 152 outputs the logic value 1.

For example, under the condition that the mismatch threshold value is 4, in response to the mismatch bit number NMB corresponding to the memory cell column CL0 being 3, the sensing amplifier 152 outputs the logic value 1. In response to the mismatch bit number NMB corresponding to the memory cell column CL1 being 7, the sensing amplifier 152 outputs the logic value 0. In response to the mismatch bit number NMB corresponding to the memory cell column CL2 being 4, the sensing amplifier 152 outputs the logic value 1. In response to the mismatch bit number NMB corresponding to the memory cell column CL128K-2 being 6, the sensing amplifier 152 outputs the logic value 0. In response to the mismatch bit number NMB corresponding to the memory cell column CL128K-1 being 7, the sensing amplifier 152 outputs the logic value 0. In response to the mismatch bit number NMB corresponding to the memory cell column CL128K being 24, the sensing amplifier 152 outputs the logic value 0. As a result, the memory system 100 performs approximate searching operations by setting the mismatch threshold value.

Figure 2:
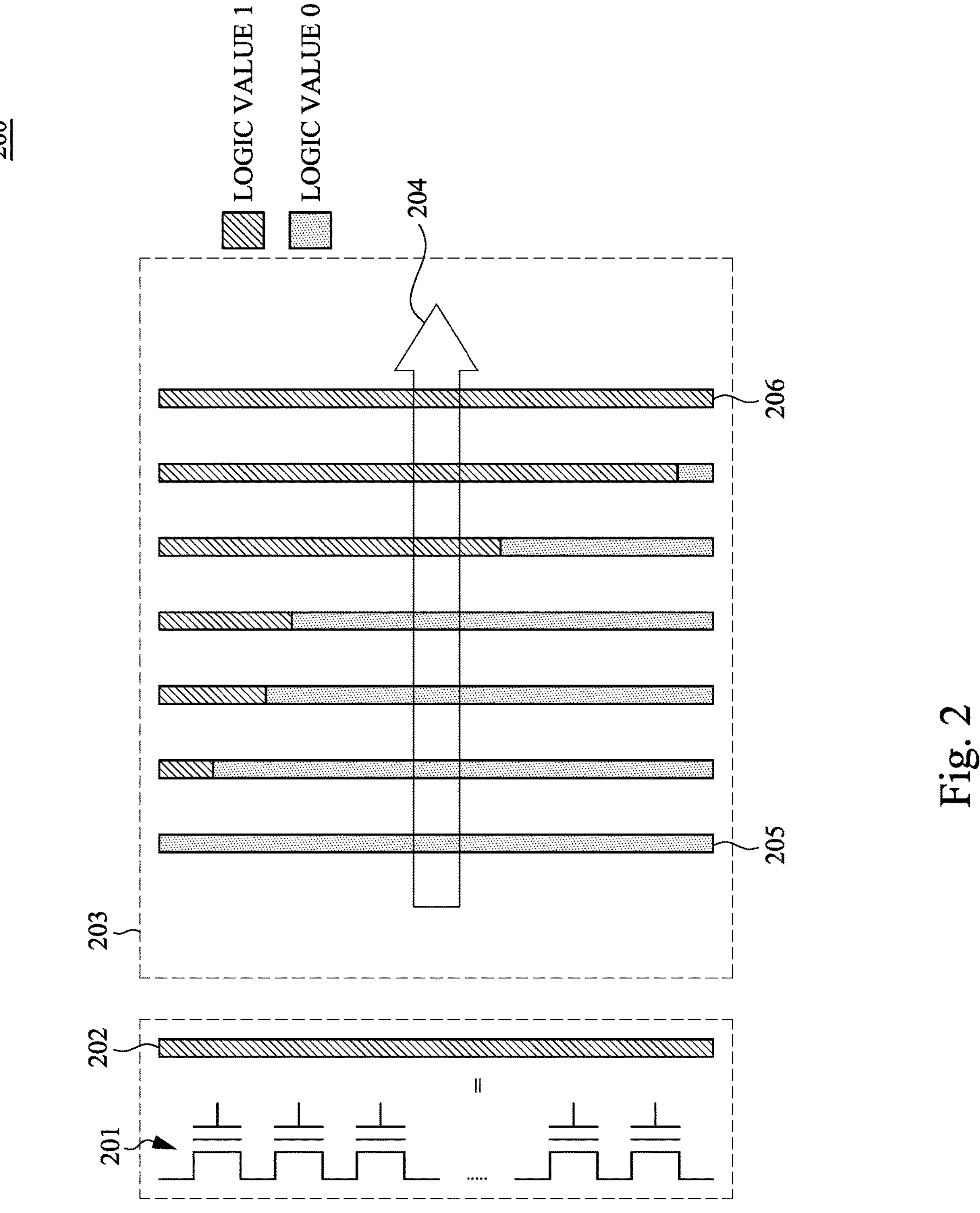
FIG. 2 is a schematic diagram of a tracking array illustrated according to some embodiments of present disclosure.

FIG. 2 is a schematic diagram of a tracking array 200 illustrated according to some embodiments of present disclosure. As shown in FIG. 2, tracking cell columns included in the tracking array 200 can be represented by rectangles, and data bits stored in the tracking cell columns be represented by screentone of the rectangles.

For example, the tracking cell column 201 can be represented by the rectangle 202, the data bits stored in the tracking cell column 201 can be represented by screentone of the rectangle 202. In the embodiment shown in FIG. 2, the slash line screentone corresponds to the logic value 1. Correspondingly, each of the data bits stored in the tracking cell column 201 has the logic value 1.

As shown in FIG. 2, the tracking array includes multiple tracking cell columns 203. The multiple tracking cell columns 203 are arranged in order along a direction of the arrow 204. Each of data bits stored in the leftmost tracking cell column 205 in the tracking cell columns 203 has the logic value 0. In the embodiment shown in FIG. 2, the dot screentone corresponds to the logic value 0. Each of data bits stored in the rightmost tracking cell column 206 in the tracking cell columns 203 has the logic value 1. Along the direction of the arrow 204, quantities of the logic value 1 are increased gradually, and quantities of the logic value 0 are decreased gradually.

In some embodiments, tracking data with all tracking bits having the logic value 1 (such as the tracking data TKDTALL1 shown in FIG. 3) can be inputted into the tracking array 200 to generate corresponding string current. Along the direction of the arrow 204, the current levels of the string currents are increased gradually. For example, the current level of the string current flowing through the tracking cell column 205 is the smallest, and the current level of the string current flowing through the tracking cell column 206 is the largest.

Referring to FIG. 1A and FIG. 2, the tracking array 200 can be an embodiment of the tracking array in the block BK1. Therefore, for brevity, some descriptions are not repeated.

Figure 3:
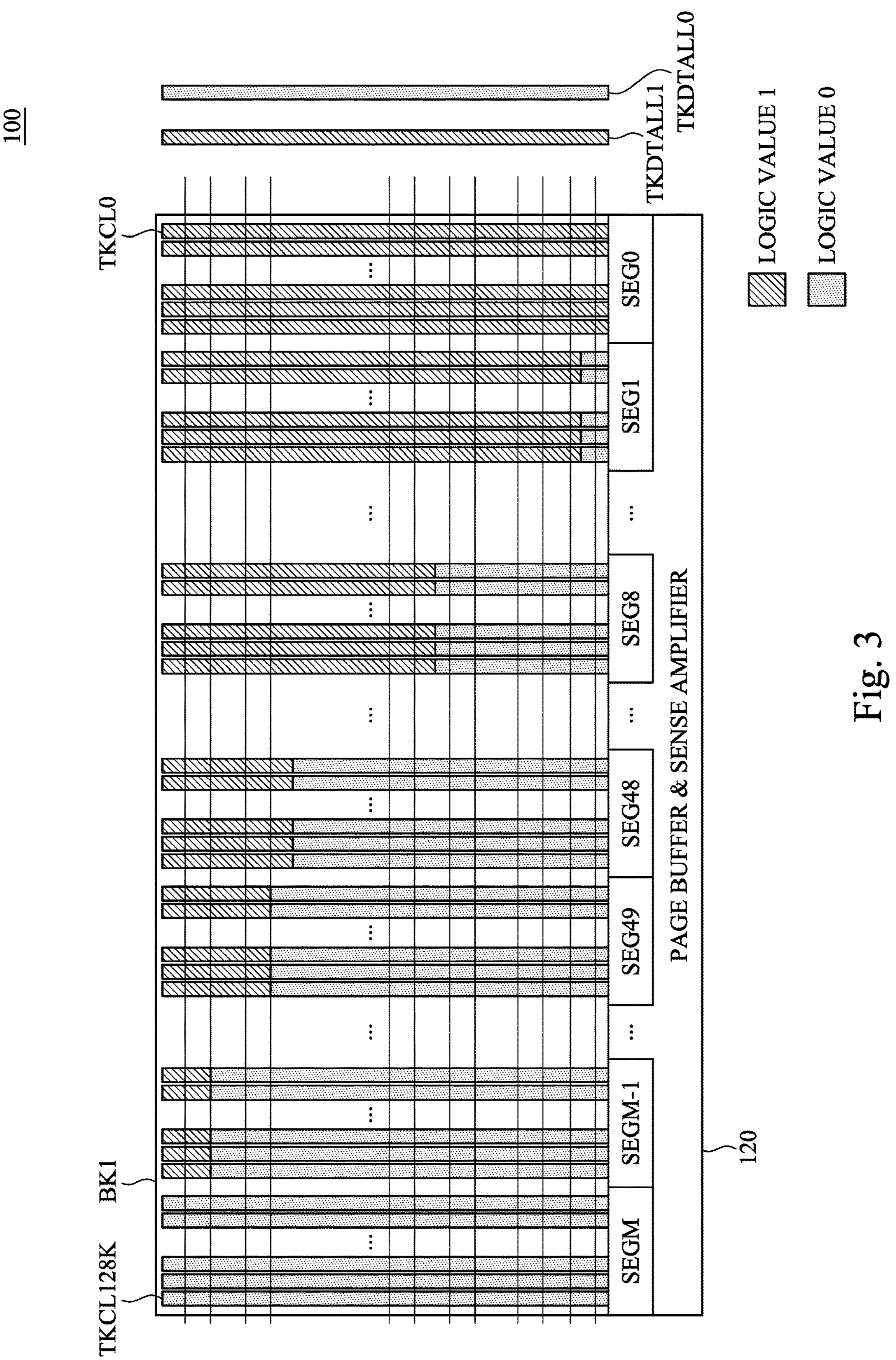
FIG. 3 is a schematic diagram of a portion of the memory system performing a tracking operation, illustrated according to some embodiments of present disclosure.

FIG. 3 is a schematic diagram of a portion of the memory system 100 performing a tracking operation, illustrated according to some embodiments of present disclosure. As shown in FIG. 3, the tracking array in the block BK1 includes tracking cell columns TKCL0-TKCL128K, and the sensing device 120 includes segment circuits SEG0-SEGM, in which M is a positive integer. In some embodiments, the segment circuits SEG0-SEGM are included in the page buffer of the sensing device 120.

In some embodiments, the tracking cell columns TKCL0-TKCL128K are coupled to the segment circuits SEG0-SEGM, and are configured to output tracking logic values to corresponding segment circuits SEG0-SEGM. In some embodiments, quantities of the tracking cell columns coupled to each of the segment circuits SEG0-SEGM are the same.

In some embodiments, the segment circuits SEG0-SEGM are configured to count the tracking logic values to generate corresponding summation values. In some embodiments, the sensing device 120 is configured to determine the sensing time according to the summation values.

As shown in FIG. 3, reference data bits stored in each tracking cell column of the tracking cell columns coupled to one of the segment circuits SEG0-SEGM are the same. For example, the reference data bits stored in each tracking cell column of the tracking cell columns coupled to the segment circuit SEG0 has M logic value 1 and 0 logic value 0. The reference data bits stored in each tracking cell column of the tracking cell columns coupled to the segment circuit SEG1 has M-1 logic value 1 and 1 logic value 0, and so on. The reference data bits stored in each tracking cell column of the tracking cell columns coupled to the segment circuit SEG8 has 8 logic value 0. The reference data bits stored in each tracking cell column of the tracking cell columns coupled to the segment circuit SEG48 has 48 logic value 0. The reference data bits stored in each tracking cell column of the tracking cell columns coupled to the segment circuit SEG49 has 49 logic value 0. The reference data bits stored in each tracking cell column of the tracking cell columns coupled to the segment circuit SEGM-1 has 1 logic value 1 and M-1 logic value 0. The reference data bits stored in each tracking cell column of the tracking cell columns coupled to the segment circuit SEGM has 0 logic value 1 and M logic value 0.

Alternatively stated, for a positive integer P, the reference data bits stored in each tracking cell column of the tracking cell columns coupled to the segment circuit SEGP has M-P logic value 1 and P logic value 0.

In some embodiments, the tracking data TKDTALL1 or TKDTALL0 can be inputted into the tracking cell columns TKCL0-TKCL128K to perform the tracking operation. The tracking bits of the tracking data TKDTALL1 have M logic value 1, and the tracking bits of the tracking data TKDTALL0 have M logic value 0. Alternatively stated, the tracking bits of the tracking data TKDTALL1 are all logic value 1, and the tracking bits of the tracking data TKDTALL0 are all logic value 0.

Correspondingly, the Hamming distance between the tracking data TKDTALL1 and the reference data bits stored in the tracking cell column of the segment circuit SEG0 is 0. The Hamming distance between the tracking data TKDTALL1 and the reference data bits stored in the tracking cell column of the segment circuit SEG1 is 1. The Hamming distance between the tracking data TKDTALL1 and the reference data bits stored in the tracking cell column of the segment circuit SEG8 is 8. The Hamming distance between the tracking data TKDTALL1 and the reference data bits stored in the tracking cell column of the segment circuit SEG48 is 48. The Hamming distance between the tracking data TKDTALL1 and the reference data bits stored in the tracking cell column of the segment circuit SEG49 is 49. The Hamming distance between the tracking data TKDTALL1 and the reference data bits stored in the tracking cell column of the segment circuit SEGM-1 is M-1. The Hamming distance between the tracking data TKDTALL1 and the reference data bits stored in the tracking cell column of the segment circuit SEGM is M.

In various embodiments, the Hamming distance can be set as the mismatch threshold value to perform the tracking operation and the following approximate searching operation. The following example is described with a condition that the mismatch threshold value is set as 8 to distinguish whether the Hamming distance is smaller or equal to 8. However, the embodiments of present disclosure are not limited to this. In other embodiments, the mismatch threshold value can be set as other values to distinguish other Hamming distance.

In some embodiments, in response to the mismatch threshold value being 8, the tracking cell columns coupled to the segment circuit SEG8 generates the tracking logic values according to the tracking data TKDTALL1. For example, referring to FIG. 2 and FIG. 1B, the tracking cell columns generate the bit line signals carrying the mismatch bit numbers NMB, and the sensing amplifier 152 generates corresponding tracking logic values according to the mismatch threshold value and the bit line signals. Then, the segment circuit SEG8 is configured to count the tracking logic values of the tracking cell columns to generate the summation value.

In some embodiments, when the sensing time of the sensing amplifier 152 sensing to generate the tracking logic values is re-defined by the tracking operation, each of the tracking logic values is the logic value 1. For example, when a quantity of the tracking cell columns coupled to the segment circuit SEG8 is one thousand, each of the one thousand tracking cell columns generates the logic value 1, such that the segment circuit SEG8 receives and count the one thousand logic value 1.

On the other hand, when a portion of the tracking logic values have the logic value 0, it represents that the current sensing time is not suitable for distinguishing the condition of the mismatch threshold value being 8. Accordingly, the sensing device 120 can fine tune the sensing time until each of the tracking cell columns coupled to the segment circuit SEG8 generates the logic value 1, such that the segment circuit SEG8 can receives and count one thousand logic value 1.

Under some conditions, high temperature and retention time increases the current levels of the string currents, such that string currents of extra strings (such as one or more of the tracking cell columns coupled to the segment circuit SEG8) will pass the current criteria after baking. Accordingly, the sensing time need to be reduced to create new reference current criteria, for avoiding those extra string currents. Details of the tracking operation performed by the sensing device 120 to adjusting the sensing time are described below with the embodiments associated with FIG. 4 to FIG. 7.

Figure 4:
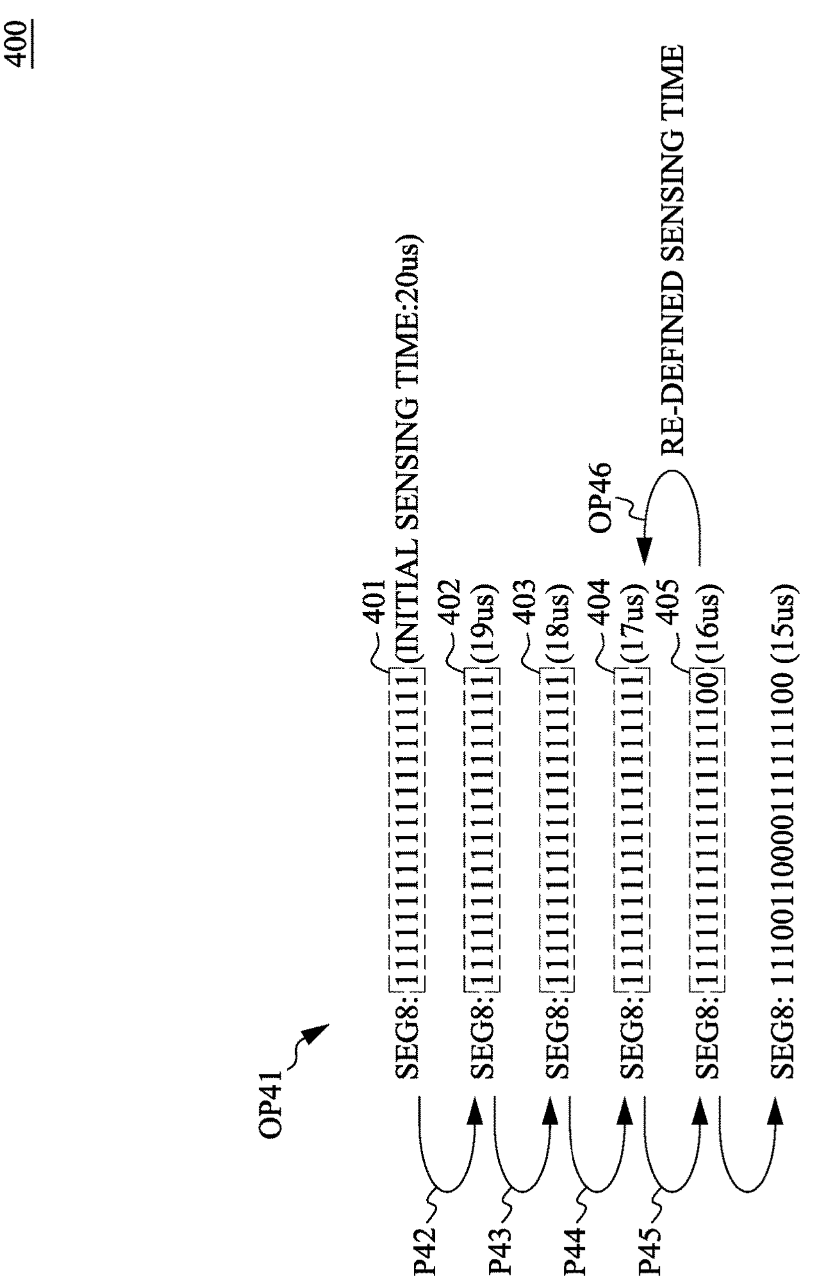
FIG. 4 is a schematic diagram of a method of the memory system performing a tracking operation to adjust a sensing time, illustrated according to some embodiments of present disclosure.

FIG. 4 is a schematic diagram of a method 400 of the memory system 100 performing the tracking operation to adjust the sensing time, illustrated according to some embodiments of present disclosure. In the embodiment shown in FIG. 4, a condition that the mismatch threshold value is set as 8 to distinguish whether the Hamming distance is smaller or equal to 8, and an initial sensing time is 20 microseconds (us) is made for example. However, the embodiments of present disclosure are not limited to this. In other embodiments, the mismatch threshold value can be set as other values to distinguish other Hamming distance, and a corresponding initial sensing time may have a time length other than 20 microseconds.

In some embodiments, the method 400 is a method for re-defining the sensing time in response to temperature and/or retention time. As shown in FIG. 4, the method 400 includes operations OP41-OP46. During the operations OP41-OP46, the sensing time is set as various sensing times to perform the corresponding tracking operation.

During the operation OP41, the memory cell columns coupled to the segment circuit SEG8 receives the tracking data TKDTALL1 to output the bit line signals, and the sensing device 120 senses the bit line signals according to the initial sensing time of 20 microseconds to generate tracking logic values 401. Each of the tracking logic values 401 has the logic value 1. Alternatively stated, the tracking logic values 401 do not include the logic value 0. In some embodiments, during the tracking operation, the bit line signals are referred to as tracking signals.

At this moment, the segment circuit SEG8 can count the tracking logic values 401 to generate the summation value corresponding to the tracking logic values 401. For example, when a quantity of the tracking cell columns coupled to the segment circuit SEG8 is one thousand, the tracking logic values 401 have one thousand logic value 1. Correspondingly, the summation value of the tracking logic values 401 is one thousand.

During the operation OP42, in response to the tracking logic values 401 not including the logic value 0, the sensing device 120 adjusts the sensing time from 20 microseconds to 19 microseconds. In the embodiment shown in FIG. 4, each time adjusting, the sensing device 120 adjusts the sensing time with a time length of 1 microsecond. However, the embodiments of present disclosure are not limited to this. In various embodiments, various time lengths, such has 0.5 microsecond of 2 microseconds, can be used for adjusting the sensing time.

Then, during the operation OP42, the memory cell columns coupled to the segment circuit SEG8 receives the tracking data TKDTALL1 to output the bit line signals, and the sensing device 120 senses the bit line signals according to the initial sensing time of 19 microseconds to generate tracking logic values 402. Each of the tracking logic values 402 has the logic value 1. Alternatively stated, the tracking logic values 402 do not include the logic value 0.

At this moment, the segment circuit SEG8 can count the tracking logic values 402 to generate the summation value corresponding to the tracking logic values 402. For example, when a quantity of the tracking cell columns coupled to the segment circuit SEG8 is one thousand, the tracking logic values 402 have one thousand logic value 1. Correspondingly, the summation value of the tracking logic values 402 is one thousand.

During the operation OP43, in response to the tracking logic values 402 not including the logic value 0, the sensing device 120 adjusts the sensing time from 19 microseconds to 18 microseconds. Then, the memory cell columns coupled to the segment circuit SEG8 receives the tracking data TKDTALL1 to output the bit line signals, and the sensing device 120 senses the bit line signals according to the initial sensing time of 18 microseconds to generate tracking logic values 403. Each of the tracking logic values 403 has the logic value 1. Alternatively stated, the tracking logic values 403 do not include the logic value 0.

At this moment, the segment circuit SEG8 can count the tracking logic values 403 to generate the summation value corresponding to the tracking logic values 403. For example, when a quantity of the tracking cell columns coupled to the segment circuit SEG8 is one thousand, the tracking logic values 403 have one thousand logic value 1. Correspondingly, the summation value of the tracking logic values 403 is one thousand.

During the operation OP44, in response to the tracking logic values 403 not including the logic value 0, the sensing device 120 adjusts the sensing time from 18 microseconds to 17 microseconds. Then, the memory cell columns coupled to the segment circuit SEG8 receives the tracking data TKDTALL1 to output the bit line signals, and the sensing device 120 senses the bit line signals according to the initial sensing time of 17 microseconds to generate tracking logic values 404. Each of the tracking logic values 404 has the logic value 1. Alternatively stated, the tracking logic values 404 do not include the logic value 0.

At this moment, the segment circuit SEG8 can count the tracking logic values 404 to generate the summation value corresponding to the tracking logic values 404. For example, when a quantity of the tracking cell columns coupled to the segment circuit SEG8 is one thousand, the tracking logic values 404 have one thousand logic value 1. Correspondingly, the summation value of the tracking logic values 404 is one thousand.

During the operation OP45, in response to the tracking logic values 404 not including the logic value 0, the sensing device 120 adjusts the sensing time from 17 microseconds to 16 microseconds. Then, the memory cell columns coupled to the segment circuit SEG8 receives the tracking data TKDTALL1 to output the bit line signals, and the sensing device 120 senses the bit line signals according to the initial sensing time of 16 microseconds to generate tracking logic values 405. A portion of the tracking logic values 405 has the logic value 0.

At this moment, the segment circuit SEG8 can count the tracking logic values 405 to generate the summation value corresponding to the tracking logic values 405. For example, when a quantity of the tracking cell columns coupled to the segment circuit SEG8 is one thousand, and two tracking cell columns in tracking cell columns generate bit line signals corresponding to the logic value 0, the tracking logic values 405 have 998 logic value 1 and two logic value 0. Correspondingly, the summation value of the tracking logic values 405 is 998. Accordingly, the summation value of the tracking logic values 405 is smaller than one thousand represents that the sensing time of 16 microseconds does not suitable for current temperature and/or retention time.

Correspondingly, during the operation OP46, in response to the tracking logic values 405 having the logic value 0, the sensing device 120 adjusts the sensing time from 16 microseconds back to 17 microseconds, and sets 17 microseconds as the re-defined sensing time.

After the operation OP46, the sensing device 120 can sense the bit line signals outputted by the computing arrays in the blocks BK2-BKM according to the sensing time of 17 microseconds, to perform the searching operation with the mismatch bit number being 8.

In summary, when the summation value of the tracking logic values is equal to the quantity of the tracking cell columns coupled to the segment circuit SEG8, the sensing device 120 can decrease the sensing time gradually and count the summation value, until the summation value of the tracking logic values 405 is smaller than the quantity of the tracking cell columns coupled to the segment circuit SEG8. After the summation value of the tracking logic values 405 is smaller than the quantity of the tracking cell columns coupled to the segment circuit SEG8, the sensing device 120 can set the previous sensing time, which corresponds to the summation value equal to the quantity of the tracking cell columns coupled to the segment circuit SEG8, as the new sensing time, and perform the searching operation according to the new sensing time.

In some embodiments, the quantity of the tracking cell columns coupled to the segment circuit SEG8 can be referred to as a preset value. Accordingly, when the summation value is different from the preset value, the sensing device 120 adjusts the sensing time. For example, the sensing device 120 adjusts the sensing time by adjusting the period of the clock signal CLK. When the summation value is equal to the preset value, the sensing device 120 determines the sensing time. For example, the sensing device 120 determines the sensing time according to the period of the clock signal CLK, and configures the period of the clock signal CLK for sensing the computing signals generated from the computing operation.

Figure 5:
FIG. 5 is a schematic diagram of a method of the memory system performing a tracking operation to adjust the sensing time, illustrated according to some embodiments of present disclosure.
Figure 5:
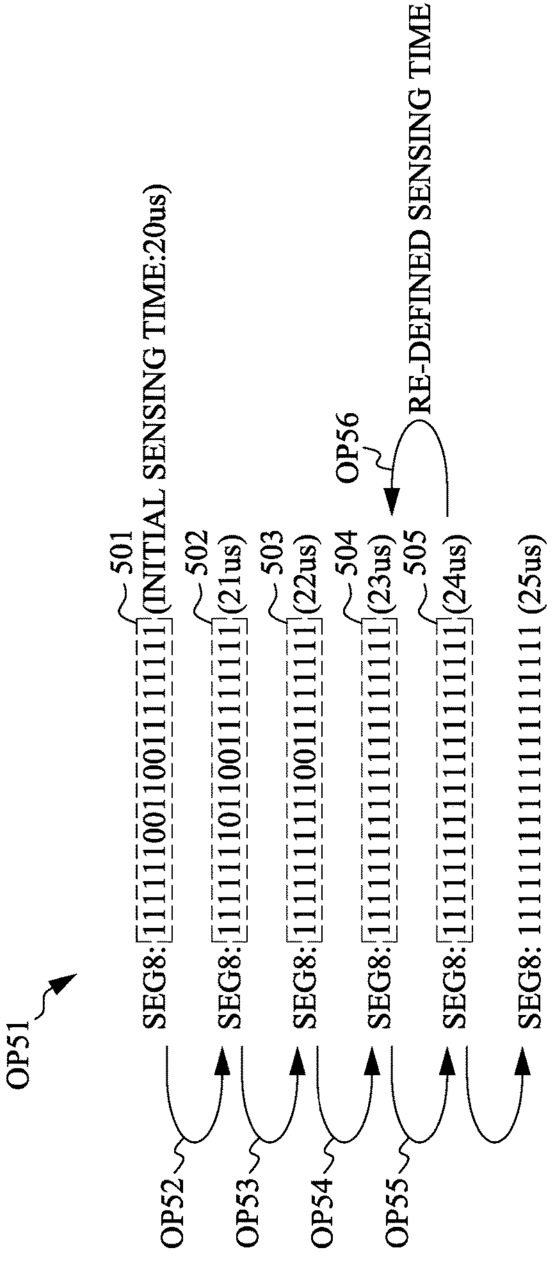

FIG. 5 is a schematic diagram of a method 500 of the memory system 100 performing a tracking operation to adjust the sensing time, illustrated according to some embodiments of present disclosure. Referring to FIG. 4 and FIG. 5, the method 500 is an alternative embodiment of the method 400. Therefore, some descriptions are not repeated for brevity.

In some embodiments, the method 500 is a method for re-defining the sensing time in response to disturbance. As shown in FIG. 5, the method 500 includes operations OP51-OP56. During the operations OP51-OP56, the sensing time is set as various sensing times to perform the corresponding tracking operation.

During the operation OP51, the memory cell columns coupled to the segment circuit SEG8 receives the tracking data TKDTALL1 to output the bit line signals, and the sensing device 120 senses the bit line signals according to the initial sensing time of 20 microseconds to generate tracking logic values 501. A portion of the tracking logic values 501 has the logic value 0.

At this moment, the segment circuit SEG8 can count the tracking logic values 501 to generate the summation value corresponding to the tracking logic values 501. For example, when a quantity of the tracking cell columns coupled to the segment circuit SEG8 is one thousand, and four tracking cell columns in tracking cell columns generate bit line signals corresponding to the logic value 0, the tracking logic values 501 have 996 logic value 1 and four logic value 0. Correspondingly, the summation value of the tracking logic values 501 is 996.

During the operation OP52, in response to the tracking logic values 501 including the logic value 0, the sensing device 120 adjusts the sensing time from 20 microseconds to 21 microseconds. Then, the memory cell columns coupled to the segment circuit SEG8 receives the tracking data TKDTALL1 to output the bit line signals, and the sensing device 120 senses the bit line signals according to the initial sensing time of 21 microseconds to generate tracking logic values 502. A portion of the tracking logic values 502 has the logic value 0.

At this moment, the segment circuit SEG8 can count the tracking logic values 502 to generate the summation value corresponding to the tracking logic values 502. For example, when a quantity of the tracking cell columns coupled to the segment circuit SEG8 is one thousand, and three tracking cell columns in tracking cell columns generate bit line signals corresponding to the logic value 0, the tracking logic values 502 have 997 logic value 1 and three logic value 0. Correspondingly, the summation value of the tracking logic values 502 is 997.

During the operation OP53, in response to the tracking logic values 502 including the logic value 0, the sensing device 120 adjusts the sensing time from 21 microseconds to 22 microseconds. Then, the memory cell columns coupled to the segment circuit SEG8 receives the tracking data TKDTALL1 to output the bit line signals, and the sensing device 120 senses the bit line signals according to the initial sensing time of 22 microseconds to generate tracking logic values 503. A portion of the tracking logic values 503 has the logic value 0.

At this moment, the segment circuit SEG8 can count the tracking logic values 503 to generate the summation value corresponding to the tracking logic values 503. For example, when a quantity of the tracking cell columns coupled to the segment circuit SEG8 is one thousand, and two tracking cell columns in tracking cell columns generate bit line signals corresponding to the logic value 0, the tracking logic values 503 have 998 logic value 1 and two logic value 0. Correspondingly, the summation value of the tracking logic values 503 is 998.

During the operation OP54, in response to the tracking logic values 503 including the logic value 0, the sensing device 120 adjusts the sensing time from 22 microseconds to 23 microseconds. Then, the memory cell columns coupled to the segment circuit SEG8 receives the tracking data TKDTALL1 to output the bit line signals, and the sensing device 120 senses the bit line signals according to the initial sensing time of 23 microseconds to generate tracking logic values 504. Each of the tracking logic values 504 has the logic value 1. Alternatively stated, the tracking logic values 504 do not include the logic value 0.

At this moment, the segment circuit SEG8 can count the tracking logic values 504 to generate the summation value corresponding to the tracking logic values 504. For example, when a quantity of the tracking cell columns coupled to the segment circuit SEG8 is one thousand, the tracking logic values 504 have one thousand logic value 1. Correspondingly, the summation value of the tracking logic values 504 is one thousand.

During the operation OP55, the sensing device 120 adjusts the sensing time from 23 microseconds to 24 microseconds. Then, the memory cell columns coupled to the segment circuit SEG8 receives the tracking data TKDTALL1 to output the bit line signals, and the sensing device 120 senses the bit line signals according to the initial sensing time of 24 microseconds to generate tracking logic values 505. Each of the tracking logic values 505 has the logic value 1. Alternatively stated, the tracking logic values 505 do not include the logic value 0.

At this moment, the segment circuit SEG8 can count the tracking logic values 505 to generate the summation value corresponding to the tracking logic values 505. For example, when a quantity of the tracking cell columns coupled to the segment circuit SEG8 is one thousand, the tracking logic values 505 have one thousand logic value 1. Correspondingly, the summation value of the tracking logic values 505 is one thousand.

During the operation OP56, in response to the tracking logic values 505 not including the logic value 0, the sensing device 120 adjusts the sensing time from 24 microseconds back to 23 microseconds, and set 23 microseconds as the re-defined sensing time.

After the operation OP56, the sensing device 120 can sense the bit line signals outputted by the computing arrays in the blocks BK2-BKM according to the sensing time of 23 microseconds, to perform the searching operation with the mismatch bit number being 8.

In summary, when the summation value of the tracking logic values is smaller than the quantity of the tracking cell columns coupled to the segment circuit SEG8, the sensing device 120 can increase the sensing time gradually and count the summation value, until each of the summation values of the tracking logic values 504 and 505 is equal to the quantity of the tracking cell columns coupled to the segment circuit SEG8. After the summation value of the tracking logic values 505 is equal to the quantity of the tracking cell columns coupled to the segment circuit SEG8, the sensing device 120 can set the sensing time corresponding to the tracking logic values 504 as the new sensing time, and perform the searching operation according to the new sensing time.

Figure 6:
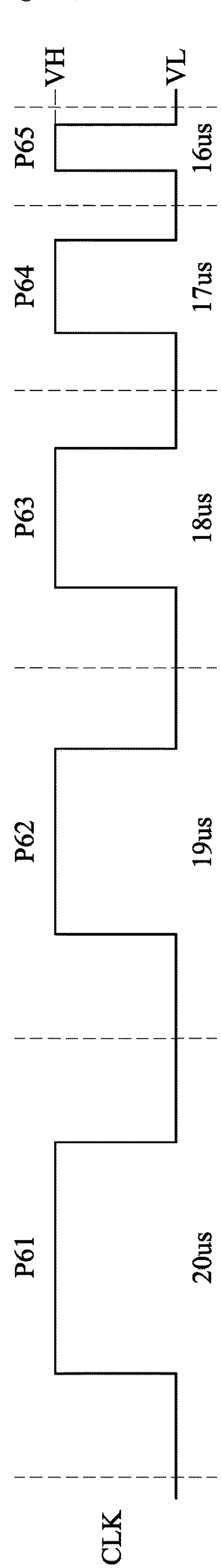
FIG. 6 is a timing diagram of the memory system performing a tracking operation to adjust the sensing time, illustrated according to some embodiments of present disclosure.

FIG. 6 is a timing diagram 600 of the memory system 100 performing a tracking operation to adjust the sensing time, illustrated according to some embodiments of present disclosure. As shown in FIG. 6, the timing diagram 600 includes periods P61-P65 arranged continuously in order.

During the period P61, the clock signal CLK has a period corresponding to 20 microseconds, and is maintained at the voltage level VH in 20 microseconds. In some embodiments, the time that the clock signal CLK is maintained at the voltage level VH corresponds to the sensing time of the sensing device 120. Correspondingly, the sensing device 120 can adjust the sensing time by adjusting the period of the clock signal CLK. For example, the sensing device can perform the sensing operation when the clock signal CLK has the voltage level VH, and does not perform the sensing operation when the clock signal CLK has the voltage level VL.

Then, between the periods P61 and P62, the clock signal CLK has the voltage level VL. In some embodiments, the voltage level VH is higher than the voltage level VL.

During the period P62, the clock signal CLK has a period corresponding to 19 microseconds, and is maintained at the voltage level VH in 19 microseconds. Then, between the periods P62 and P63, the clock signal CLK has the voltage level VL.

During the period P63, the clock signal CLK has a period corresponding to 18 microseconds, and is maintained at the voltage level VH in 18 microseconds. Then, between the periods P63 and P64, the clock signal CLK has the voltage level VL.

During the period P64, the clock signal CLK has a period corresponding to 17 microseconds, and is maintained at the voltage level VH in 17 microseconds. Then, between the periods P64 and P65, the clock signal CLK has the voltage level VL.

During the period P65, the clock signal CLK has a period corresponding to 16 microseconds, and is maintained at the voltage level VH in 16 microseconds. Then, after the period P65, the clock signal CLK has the voltage level VL.

Referring to FIG. 4 and FIG. 6, the periods P61-P65 can correspond to the operations OP41-OP45, respectively. For example, the sensing device 120 can perform the operations OP41-OP45 during the periods P61-P65, respectively, according to the clock signal CLK.

In summary, during the operations OP41-OP46, the sensing device 120 counts the tracking logic values of the segment circuit SEG8 to generate the summation value, and compares the summation value and the preset number (such as the quantity of the tracking logic columns coupled to the segment circuit SEG8). When the summation value is equal to the preset number, the sensing device 120 decreases the period of the clock signal CLK, such as decreasing from the period corresponding to 20 microseconds to the period corresponding to 16 microseconds gradually. When the summation value is different from the preset number, the sensing device 120 increases the period of the clock signal CLK, such as increasing from the period corresponding to 16 microseconds back to the period corresponding to 17 microseconds, and determines the period of 17 microseconds as the period for the computing operation. Then, after the period of the clock signal CLK is determined, the memory system 100 can perform the computing operation and sense the computing signals from the computing operation according to the period corresponding to 17 microseconds.

Figure 7:
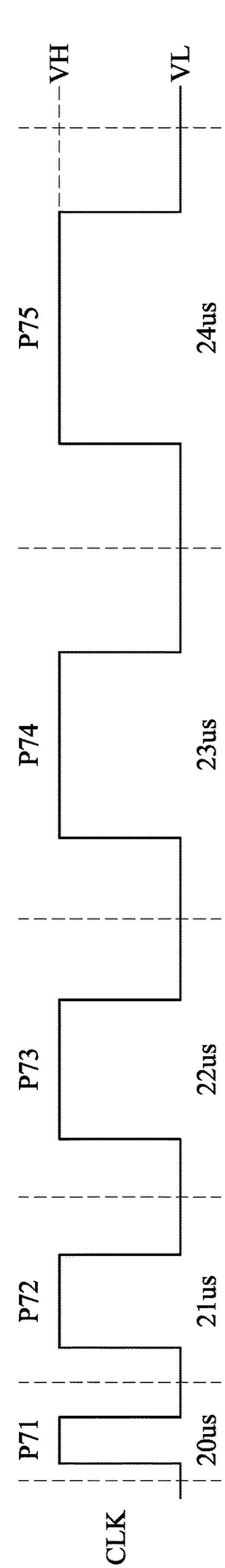
FIG. 7 is a timing diagram of the memory system performing a tracking operation to adjust the sensing time, illustrated according to some embodiments of present disclosure.

FIG. 7 is a timing diagram 700 of the memory system 100 performing a tracking operation to adjust the sensing time, illustrated according to some embodiments of present disclosure. As shown in FIG. 7, the timing diagram 700 includes periods P71-P75 arranged continuously in order.

During the period P71, the clock signal CLK has a period corresponding to 20 microseconds, and is maintained at the voltage level VH in 20 microseconds. Then, between the periods P71 and P72, the clock signal CLK has the voltage level VL.

During the period P72, the clock signal CLK has a period corresponding to 21 microseconds, and is maintained at the voltage level VH in 21 microseconds. Then, between the periods P72 and P73, the clock signal CLK has the voltage level VL.

During the period P73, the clock signal CLK has a period corresponding to 22 microseconds, and is maintained at the voltage level VH in 22 microseconds. Then, between the periods P73 and P74, the clock signal CLK has the voltage level VL.

During the period P74, the clock signal CLK has a period corresponding to 23 microseconds, and is maintained at the voltage level VH in 23 microseconds. Then, between the periods P74 and P75, the clock signal CLK has the voltage level VL.

During the period P75, the clock signal CLK has a period corresponding to 24 microseconds, and is maintained at the voltage level VH in 24 microseconds. Then, after the period P75, the clock signal CLK has the voltage level VL.

Referring to FIG. 5 and FIG. 7, the periods P71-P75 can correspond to the operations OP51-OP55, respectively. For example, the sensing device 120 can perform the operations OP51-OP55 during the periods P71-P75, respectively, according to the clock signal CLK.

In summary, during the operations OP51-OP56, the sensing device 120 counts the tracking logic values of the segment circuit SEG8 to generate the summation value, and compares the summation value and the preset number (such as the quantity of the tracking logic columns coupled to the segment circuit SEG8). When the summation value is different from the preset number, the sensing device 120 increases the period of the clock signal CLK, such as increasing from the period corresponding to 20 microseconds to the period corresponding to 24 microseconds gradually. When two summation values are equal to the preset number, the sensing device 120 decreases the period of the clock signal CLK.

For example, when the two summation values generated by the period corresponding to 23 microseconds and the period corresponding to 24 microseconds are both one thousand, the sensing device 120 decreases the clock signal CLK from the period corresponding to 24 microseconds to the period corresponding to 23 microseconds, and determines the period of 23 microseconds as the period for the computing operation. Then, after the period of the clock signal CLK is determined, the memory system 100 can perform the computing operation and sense the computing signals from the computing operation according to the period corresponding to 23 microseconds.

Figure 8:
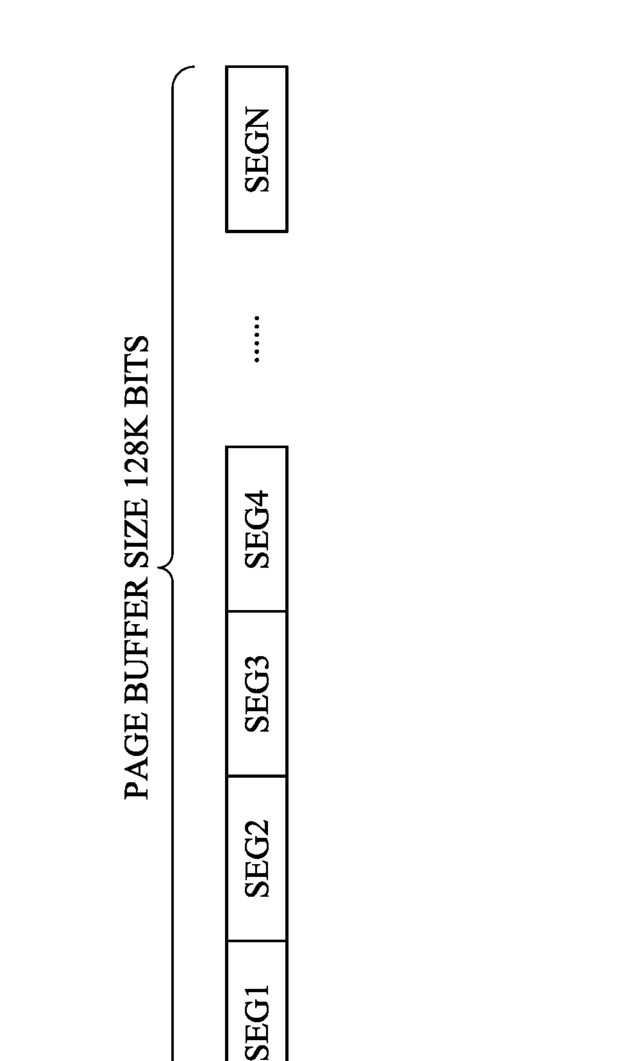
FIG. 8 is a schematic diagram of a portion of a sensing device illustrated according to some embodiments of present disclosure.

FIG. 8 is a schematic diagram of a portion of the sensing device 120 illustrated according to some embodiments of present disclosure. As shown in FIG. 8, the sensing device 120 includes N segment circuits SEG1-SEGN, in which N is a positive integer. Each of the segment circuits SEG1-SEGN is included in the page buffer.

In the embodiment shown in FIG. 8, the page buffer is configured to process 128K bit line signals. Correspondingly, the size of the page buffer is 128K. However, the embodiments of present disclosure are not limited to this. In various embodiments, the page buffer can have various sizes.

In some embodiments, the memory system 100 can adjust the size of the segment circuits SEG1-SEGN by adjusting the positive integer N. For example, when the positive integer N is 128, each of the segment circuits SEG1-SEGN has the size of 1K (such as, 1024 bits). At this moment, the segment circuits SEG1-SEGN can configured for distinguishing Hamming distances from 0 to 127.

For another example, when the positive integer N is 256, each of the segment circuits SEG1-SEGN has the size of 0.5K (such as, 512 bits). At this moment, the segment circuits SEG1-SEGN can configured for distinguishing Hamming distances from 0 to 255.

In summary, when the size of the segment circuits SEG1-SEGN is smaller, a quantity of the Hamming distances those can be distinguished by the segment circuits SEG1-SEGN is larger. On the other hand, when the size of the segment circuits SEG1-SEGN is larger, the tracking operation performed by the segment circuits SEG1-SEGN is more accurate. In various embodiments, the size of the segment circuits SEG1-SEGN can be selected according to various specification requirements.

Figure 9:
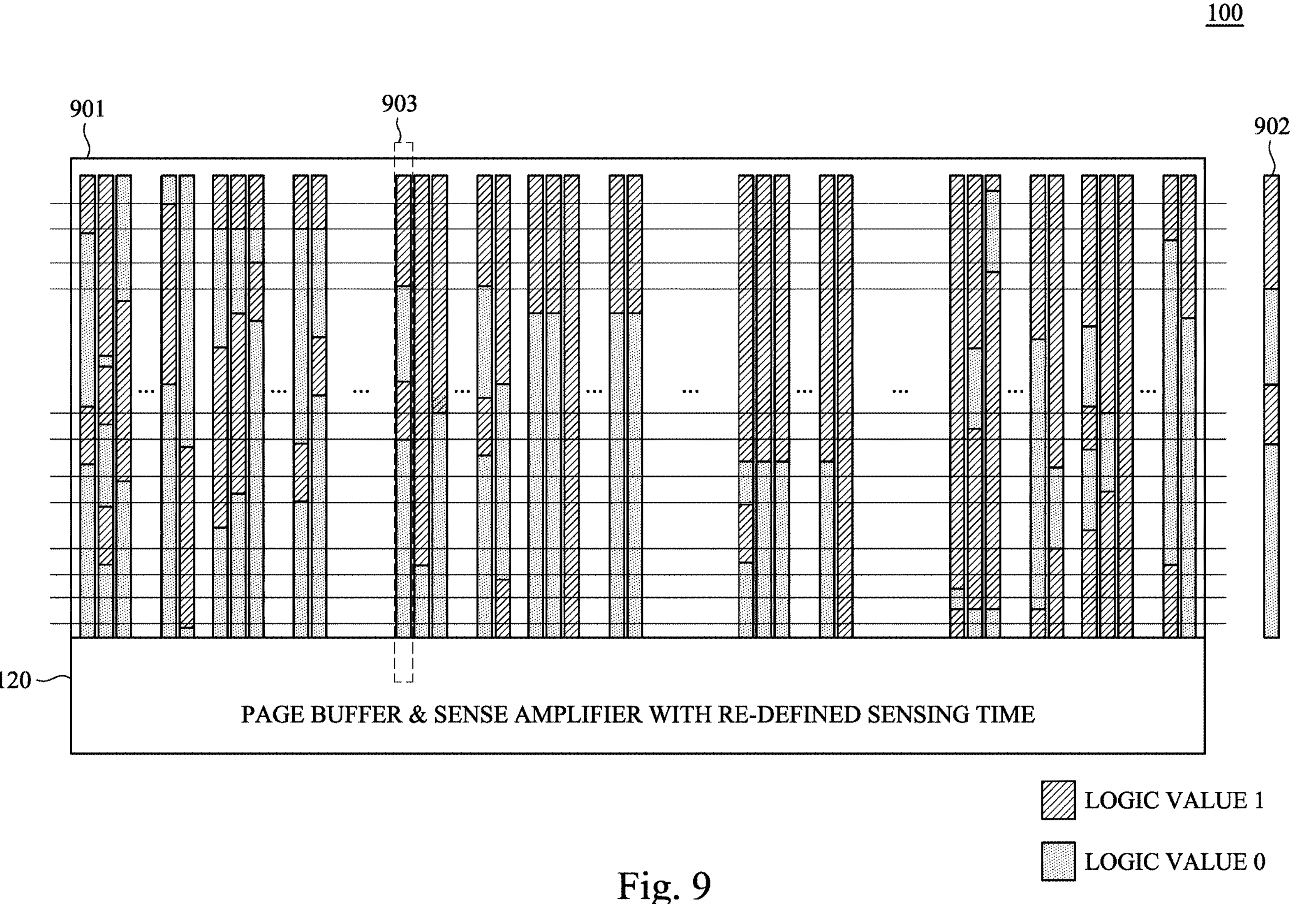
FIG. 9 is a schematic diagram of a portion of the memory system performing a computing operation illustrated according to some embodiments of present disclosure.

FIG. 9 is a schematic diagram of a portion of the memory system 100 performing a computing operation illustrated according to some embodiments of present disclosure. As shown in FIG. 9, the memory system 100 includes the computing array 901. The computing array 901 includes multiple memory cell columns. Referring to FIG. 1A and FIG. 9, the computing array 901 can be the computing array of one of the blocks BK2-BKM. Referring to FIG. 1B and FIG. 9, the memory cell columns in the computing array 901 can be implemented by the memory cell columns CL0-CL128K.

In some embodiments, the computing array 901 is configured to receive search data 902 to perform the computing operation, such as the search operation. When the search operation is performed, the computing array 901 compares the search bits of the search data 902 and the data bits of the memory cell columns in the computing array 901, to generate the corresponding bit line signals BL0-BL128K. In some embodiments, during the computing operation, the bit line signals BL0-BL128K can be referred to as computing signals.

In some embodiments, the search operation is performed after the re-defined sensing time is generated by the tracking operation described by the embodiment shown in FIG. 3. Correspondingly, the sensing device 120 can store the re-defined sensing time, and perform the sensing operation according to the re-defined sensing time.

When the sensing device 120 performs the sensing operation, the sensing device 120 determines whether the search data 902 matches the data bits of the memory cell columns according to the computing signals and the mismatch threshold value. When the search data 902 matches the data bits of the memory cell columns, the sensing device 120 generates the logic value 0. When the search data 902 mismatches the data bits of the memory cell columns, the sensing device 120 generates the logic value 1.

For example, in the embodiment shown in FIG. 9, the data bits of the memory cell column 903 in the computing array 901 matches the search data 902, and the data bits of the other memory cell columns in the computing array 901 mismatches the search data 902. Correspondingly, the sensing device 120 generates the logic value 1 in response to the computing signal of the memory cell column 903, and sensing device 120 generates the logic values 0 in response to the computing signals of the other memory cell columns.

Referring to FIG. 3 and FIG. 9, when the tracking array in the block BK1 performs the tracking operation, the segment circuits SEG0-SEGM are activated. When the computing operation, the segment circuits SEG0-SEGM are deactivated. The reference data bits stored in the tracking array in the block BK1 have regular patterns. For example, the tracking cell columns coupled to the same segment circuit has the same reference data bits, quantities of the reference data bits having the logic value 1 are increased gradually from left to right, and quantities of the reference data bits having the logic value 0 are decreased gradually from left to right. On the other hand, when the computing operation is performed, the search data 902 inputted into the computing array 901 has random pattern.

Furthermore, when the tracking operation is performed, the tracking data TKDTALL1 or TKDTALL0 inputted into the block BK1 has uniform pattern, that is, all tracking bits of the tracking data TKDTALL1 has the logic value 1 and all tracking bits of the tracking data TKDTALL1 has the logic value 0. On the other hand, when the computing operation is performed, the computing data 902 inputted into the computing array 901 has random pattern.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operating method of a memory system, comprising:
- inputting tracking data into a tracking array;
- generating a plurality of tracking logic values by a plurality of tracking cell columns in the tracking array according to the tracking data;
- counting the plurality of tracking logic values to generate a summation value;
- adjusting a sensing time of a sensing device according to the summation value;
- performing a computing operation by a computing array to generate a plurality of computing signals;
- sensing the plurality of computing signals by the sensing device according to the adjusted sensing time and a clock signal;
- when the summation value is different from a preset value, adjusting a period of the clock signal;
- setting the sensing time as a first sensing time;
- generating a plurality of tracking signals according to the tracking data by the plurality of tracking cell columns;
- sensing the plurality of tracking signals according to the first sensing time to generate a plurality of first tracking logic values;
- counting the plurality of first tracking logic values to generate a first summation value;
- when the first summation value is equal to a quantity of the plurality of tracking cell columns, setting the sensing time as a second sensing time,
- wherein the second sensing time is smaller than the first sensing time;
- sensing the plurality of tracking signals according to the second sensing time to generate a plurality of second tracking logic values;
- counting the plurality of second tracking logic values to generate a second summation value;
- when the second summation value is different from the quantity of the plurality of tracking cell columns, setting the sensing time as the first sensing time;
- sensing the plurality of computing signals according to the first sensing time by the sensing device;
- before setting the sensing time as the first sensing time, setting the sensing time as an initial sensing time;
- sensing the plurality of tracking signals according to the initial sensing time to generate a plurality of initial tracking logic values;
- counting the plurality of initial tracking logic values to generate an initial summation value; and
- when the initial summation value is equal to the quantity of the plurality of tracking cell columns, setting the sensing time as a third sensing time,
- wherein the third sensing time is smaller than the initial sensing time, and
- a difference between the third sensing time and the initial sensing time is equal to a difference between the first sensing time and the second sensing time.

2. The operating method of claim 1, wherein adjusting the sensing time of the sensing device according to the summation value comprises:
- comparing the summation value and a quantity of the plurality of tracking cell columns;
- when the summation value is different from the quantity of the plurality of tracking cell columns, adjusting the sensing time; and
- when the summation value is equal to the quantity of the plurality of tracking cell columns, determining the sensing time.

3. The operating method of claim 1, wherein each of tracking bits of the tracking data has the same logic value.

4. A memory system, comprising:
- a plurality of tracking cell columns configured to generate a plurality of tracking logic values according to tracking data;
- a computing array configured to generate a plurality of computing signals; and
- a sensing device configured to sense the plurality of computing signals according to a clock signal,
- wherein the sensing device comprises a segment circuit configured to count the plurality of tracking logic values to generate a summation value,
- when the summation value is different from a preset value, a period of the clock signal is adjusted, and when the summation value is equal to the preset value, the period of the clock signal is determined for sensing the plurality of computing signals, wherein the preset value is a quantity of the plurality of tracking cell columns.

5. The memory system of claim 4, wherein reference data bits stored in each tracking cell column of the plurality of tracking cell columns has P first logic value, and P is a positive integer.

6. The memory system of claim 4, further comprising:

a tracking array comprising the plurality of tracking cell columns, and configured to store a plurality of tracking bits, wherein along a direction, a quantity of a first logic value of the plurality of tracking bits is increased gradually.

7. The memory system of claim 6, wherein along the direction, a quantity of a second logic value of the plurality of tracking bits is decreased gradually, and the first logic value is different from the second logic value.

* * * * *